United States Patent [19]

Aizaki

[11] Patent Number: 5,115,434
[45] Date of Patent: May 19, 1992

[54] DIFFERENT POWER SOURCE INTERFACE CIRCUIT

[75] Inventor: Akane Aizaki, Tokyo, Japan

[73] Assignee: NEC Corporation, Japan

[21] Appl. No.: 651,137

[22] Filed: Feb. 6, 1991

[30] Foreign Application Priority Data

Feb. 6, 1990 [JP] Japan .................................. 2-27603

[51] Int. Cl.⁵ ...................... H03K 19/092; H03K 3/01
[52] U.S. Cl. ................................. 307/475; 307/296.1; 307/451
[58] Field of Search ...................... 307/475, 451, 296.1, 307/448

[56] References Cited

U.S. PATENT DOCUMENTS

| | | | |
|---|---|---|---|
| 3,835,457 | 9/1974 | Yu ........................................ | 307/475 |
| 4,080,539 | 3/1978 | Stewart ............................... | 307/475 |
| 4,469,959 | 9/1984 | Luke et al. ......................... | 307/451 |
| 4,471,242 | 9/1984 | Noufer ................................ | 307/451 |
| 4,475,050 | 10/1984 | Noufer ............................... | 307/296.1 |
| 4,723,082 | 2/1988 | Asano et al. ....................... | 307/475 |

OTHER PUBLICATIONS

IEEE Spectrum, Apr. 1987, "Chip Voltage:Why Less Is Better", Chou et al.
IBM Technical Disclosure Bulletin, vol. 32, No. 7, Dec. 1989, "5-Volt Signal Level Shifter In a 3 Volt CMOS Circuit".

Primary Examiner—Edward P. Westin
Assistant Examiner—Richard Roseen
Attorney, Agent, or Firm—Leydig, Voit & Mayer

[57] ABSTRACT

A different power sources interface circuit for connecting a first power source operating circuit for supplying complementary outputs with a second power source operating circuit having a power source for supplying a voltage higher than that of the power source of the first power source circuit comprises an input transistor circuit including first and second N channel MOS transistors which are in series connected between said second power source and a ground and have respective gates to which the complementary outputs of said first power circuit are supplied; a first inverter circuit having an input connected with a connection between both said transistors; and a second inverter circuit having an input and an output thereof which are connected with the output and input of said first inverter circuit, respectively.

1 Claim, 3 Drawing Sheets

DIFFERENT POWER SOURCE INTERFACE CIRCUIT

FIELD OF THE INVENTION

The present invention relates to a different power source interface circuit, and in particular to a different power source interface circuit which connects circuits having different power sources via a complementary MOS circuit.

BACKGROUND OF THE INVENTION

Recently transistors having a short gate length have been used in association with high integration of semiconductor integrated circuits. A memory circuit and the like comprising such transistors having a short gate length adopts a circuit for generating an internal power source voltage ranging 3 through 4 voltages for internal components by a constant voltage generating circuit provided therein in addition to an external power source of 5 volts in view of reliability. Accordingly, circuits to which the external power source voltage is supplied and circuits to which internal power source voltage is supplied coexist in this memory.

For example, circuits such as first stage transistors to which addresses, clocks and data are inputted and an output transistors, which are connected with input/output terminals are supplied with a power source voltage different from a voltage supplied to the other internal circuits.

FIG. 1 is a circuit diagram showing a prior art different power source interface.

As shown in FIG. 1, such interface circuit comprises inverter circuits 7, 5 and 8 which are in series connected for connecting a first power source ($V_I$) circuit 1 with a second power source ($V_E$) circuit 2. The inverter circuit 7 is supplied with a voltage $V_{I(V)}$ from a first power source $V_{CCI}$ while the inverter circuits 5 and 8 are supplied with a voltage $V_{E(V)}$ higher than the voltage $V_I$ of the first power source. Each of inverter circuits 7, 5 and 8 comprises pairs of P and N channel MOS transistors Q1, Q2; Q5, Q6; and Q9, Q10, respectively. References N1, N2, N4 and N5 represent nodes.

It is assumed herein that voltages $V_I$ and $V_E$ have relation $V_E > V_I$ and there is a relation $V_E - V_I \geq |V_{TP}|$ wherein $V_{TP}$ represents a threashold voltages of the P channel MOS transistors.

FIG. 2 is a graph showing the voltage characteristics at each node in the interface circuit shown in FIG. 1.

As shown in FIG. 2, the voltages at anodes N1 and N2, N4 and N5 exhibit opposite polarities with each other.

A case in which the node N1 is at an "L" level, that is 0V will be described at this time the transistor Q1 of the inverter circuit 7 is turned ON and the transistor Q2 is turned OFF and the note N2 is at an "H" level. Since the transistor Q6 of the inverter circuit 5 is turned ON and there is a relation $V_E - V_1 \geq |V_{TP}|$, the transistor Q5 is turned ON. Therefore, the potential of the node N4 is $\alpha(V)$ which is determined by the ratio of capacities of the transistors Q5 and Q6. If the transistor Q9 of the inverter circuit 8 is turned ON and the voltage $\alpha$ satisfies a relation $\alpha < V_{TN}$ wherein represents the threshold voltage of the N channel MOS transistor, the transistor Q10 would be turned ON and the node N5 would assume $V_{E(V)}$. If $\alpha \geq V_{TN}$, the transistor Q10 is turned ON, the voltage at the node N5 assumes $V_E - \beta$ (V) which is determined by the ratio of the capacities of the transistors Q9 and Q10.

When the node N1 is at on "W" level, that is $V_{I(V)}$, the transistor Q1 of the inverter circuit 7 is turned OFF, that is, at 0 volt.

FIG. 3 is a circuit diagram showing another prior art different power source interface circuit.

As shown in FIG. 3, such an interface circuit comprises a plurality of first power source operating circuits ($V_{CCI}$) 1. In this case, the interface circuit further includes a second power source operating circuit 2 having a voltage $V_{CCE}$ higher than the voltage $V_{CCI}$ of the first power source and an NOR circuit 9 comprising P channel MOS transistors Q11, Q12 and N channel MOS transistor Q13 and Q14.

That is, the interface circuit shown in FIG. 3 comprises a two-input NOR circuit 9 which is connected with the outputs of the inverter circuits 7A and 7B of the first power source operating circuit 1 and an inverter circuit 8 which is in series connected with the NOR circuit 9. Since the transistor Q11 and Q12 are always turned ON in the interface circuit independently of the potentials of the nodes N2A and N2B are at an "L" level.

When $V_{CCE} - V_{CCI} \geq |V_{TP}|$ in the above mentioned prior art difference power source interface circuit wherein $V_{CCI}$ is a voltage supplied from the first voltage source circuit and $V_{CCE}$ is a voltage supplied from the second power source operating circuit, which is lower than the voltage $V_{CCE}$, the channel MOS transistor having a gate electrode to which an output of a circuit supplied with the voltage $V_{CCI}$ and a source electrode which is supplied with the voltage $V_{CCE}$ is always turned ON independently of the potential of the gate. Accordingly, there is a disadvantage that a through-current flows through the second power circuit which supplies the voltage $V_{CCE}$.

In other words, the prior art shown in FIG. 4 has a disadvantage that a through-current always flows through the inverter circuit 5. Since the "L" level output will not completely fall to zero due to the ratio of capabilities of the transistors Q5 and Q6, making the rating of the transistor Q5 larger than that of the transistor Q6, the "L" level output becomes an intermediate level, resulting in that a through current will also flow through the inverter circuit 8 at the next stage. This may offer a disadvantage of possible malfunction in addition to an increase in consumed current due to the through-current.

Therefore, it is an object of the present invention to provide an interface circuit for different power source which cannot only avoid such through-current, but also avoid an increase in consummed current and malfunction.

SUMMARY OF THE INVENTION

In order to accomplish the above object, the present invention provides a different power sources interface circuit for connecting a first power source operating circuit for supplying complementary outputs with a second power source operating circuit having a power source for supplying a voltage higher than that of the power source of the first power source operating circuit, comprising an input transistor circuit including first and second N channel MOS transistors which are in series connected between said second power source and a ground and have respective gates to which the complementary outputs of said first power circuit are supplied; a first inverter circuit having an input connected with a connection between both said transistors; and a second inverter circuit having an input and an output thereof which are connected with the output and input of said first inverter circuit, respectively.

In accordance with the present invention, a through current can be prevented from flowing through respective inverter circuits and an increase in consumed current and malfunction can be prevented since the potential at each node can be selected so that an "L" level is zero volt and an "H" level is a power source level.

BRIEF DESCRIPTION OF THE DRAWINGS

The above and the other objects and advantages of the present invention will become more clear by reading the description of the embodiments with reference to the drawings in which.

DESCRIPTION OF THE EMBODIMENTS

The present invention will be described in detail with reference to annexed drawings.

Figure 4:
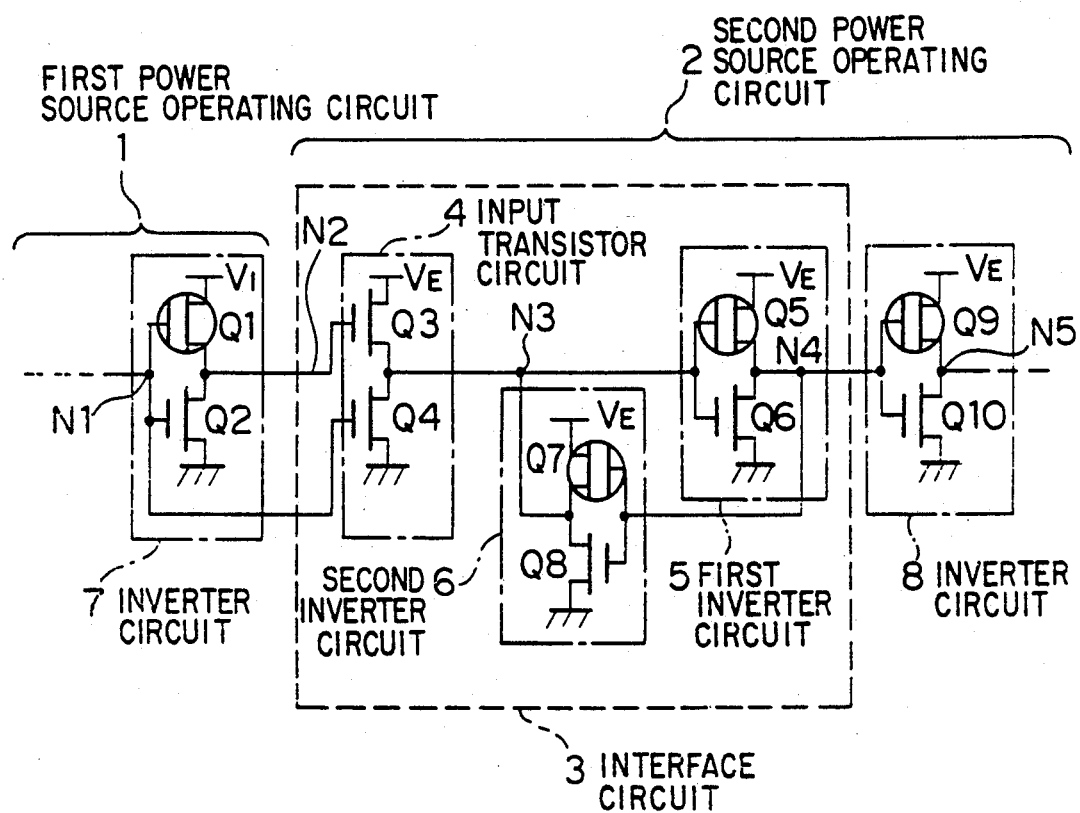
FIG. 4 is a wiring diagram showing a first embodiment of an interface circuit for different power source of the present invention.

Referring now to FIG. 4, there is shown a first embodiment of an interface circuit for different power sources of the present invention.

As shown in FIG. 4, the interface circuit of the present invention comprises an input transistor circuit 4 including first and second N channel MOS transistors Q3 and Q4 which are in series connected between a ground and a second power source operating circuit providing a second voltage $V_E$ higher than a first voltage $V_I$ of a first power source circuit; a first inverter circuit 5 having a gate input connected with a connection between the N channel MOS transistors Q3 and Q4, which includes P and N channels MOS transistors Q4 and Q5; and a second inverter circuit 6 having an input connected with an output of the first inverter 5 and an output connected the input of the first inverter circuit 5, which includes P and N channel MOS transistors Q7 and Q8. The input and output of the inverter circuit 7 which forms a first power source circuit 1 are connected with the inputs of the gate of two N channel MOS transistors Q3 and Q4 of the interface circuit 3, respectively. The output of the first circuit 5 which forms an interface circuit 3 is supplied to the input of an inverter circuit 8 including P and N channel MOS transistors Q9 and Q10.

Figure 1:
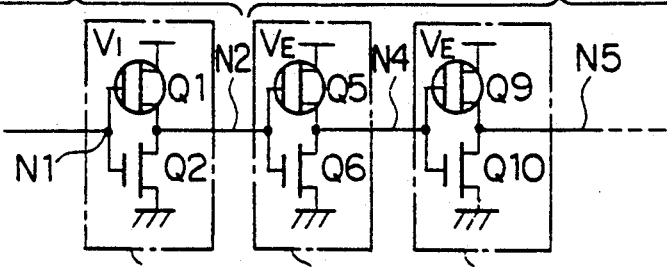
FIG. 1 is a circuit diagram showing a prior art interface circuit for different power sources.
Figure 2:
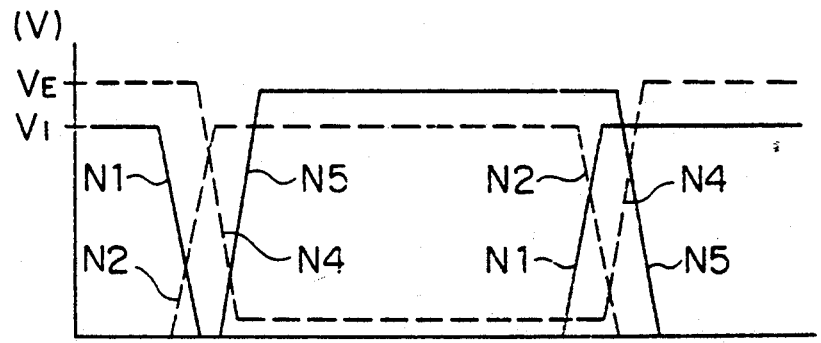
FIG. 2 is a graph showing voltages of various nodes in the interface circuit shown in FIG. 2.

The inverter circuit 5 in the afore-mentioned prior art in FIG. 1 is replaced with this interface circuit 3. The inverter circuit 7 including P and N channel MOS transistors Q1 and Q2 is supplied with a voltage $V_I$ from the first power source operating circuit 1 and the other circuits are supplied with a voltage $V_E$ from the second power source operating circuit 2.

Figure 5:
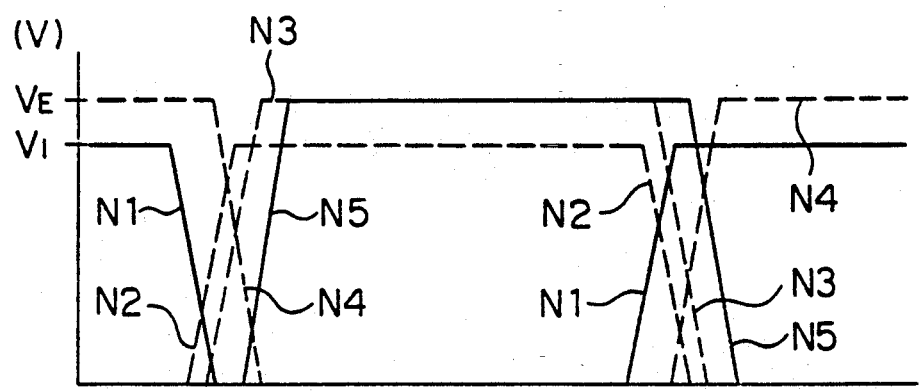
FIG. 5 is a graph showing voltages at various nodes in the interface circuit shown in FIG. 4.

Referring now to FIG. 5, there are shown voltages at various nodes in the interfacer shown in FIG. 4.

As shown in FIG. 5, references N1 through N5 represent voltages at various nodes shown in FIG. 4. Comparison of the voltage characteristics shown in FIG. 5 with those of the afore-mentioned prior art shows that the voltage at the nodes N4 falls to zero and the "H" level at nodes N3 through N5 is equal to a voltage $V_E$.

Now, operation of such an interface circuit will be described.

When the node N1 is at a "L" level, that is, zero volt, the transistors Q1 and Q2 of the inverter circuit 7 is turned ON and OFF, respectively and the node N2 is at a "H" level, that is, $V_I$ volt. Accordingly, the transistor Q3 having the gate electrode connected with the node N2 is turned ON and the transistor Q4 having the gate electrode connected with the node N1 is turned OFF so that the potential at the node N3 increases. The nodes N3 and N4 become $V_E$ and zero volt, respectively by a flip-flop formed of first and second inverter circuits 5 and 6. Since the P and N channel MOS transistors Q9 and Q10 which form the inverter circuit 8 are turned ON and OFF, respectively, the node N5 becomes $V_E$ volt.

Since the transistors Q1 and Q2 of the inverter circuit 7 are turned OFF and ON, respectively when the node N1 is at an "H" level, that is, $V_I$ volt, the node N2 is brought into an "L" level. The transistors Q3 and Q4 which form the input transistor circuit 4 are turned OFF and ON, respectively, the potential of the node N3 will lower. The nodes N3 and N4 are then brought into 0 and $V_E$ volts, respectively by the flip-flop formed by the inverter circuits 5 and 6. Since the transistors Q9 and Q10 of the inverter circuit 8 are rendered ON and OFF, respectively, the node N5 becomes zero volt. That is, the phase of the node is rendered opposite to that of the node N1 to assume a logical state same as that of the prior art.

Figure 6:
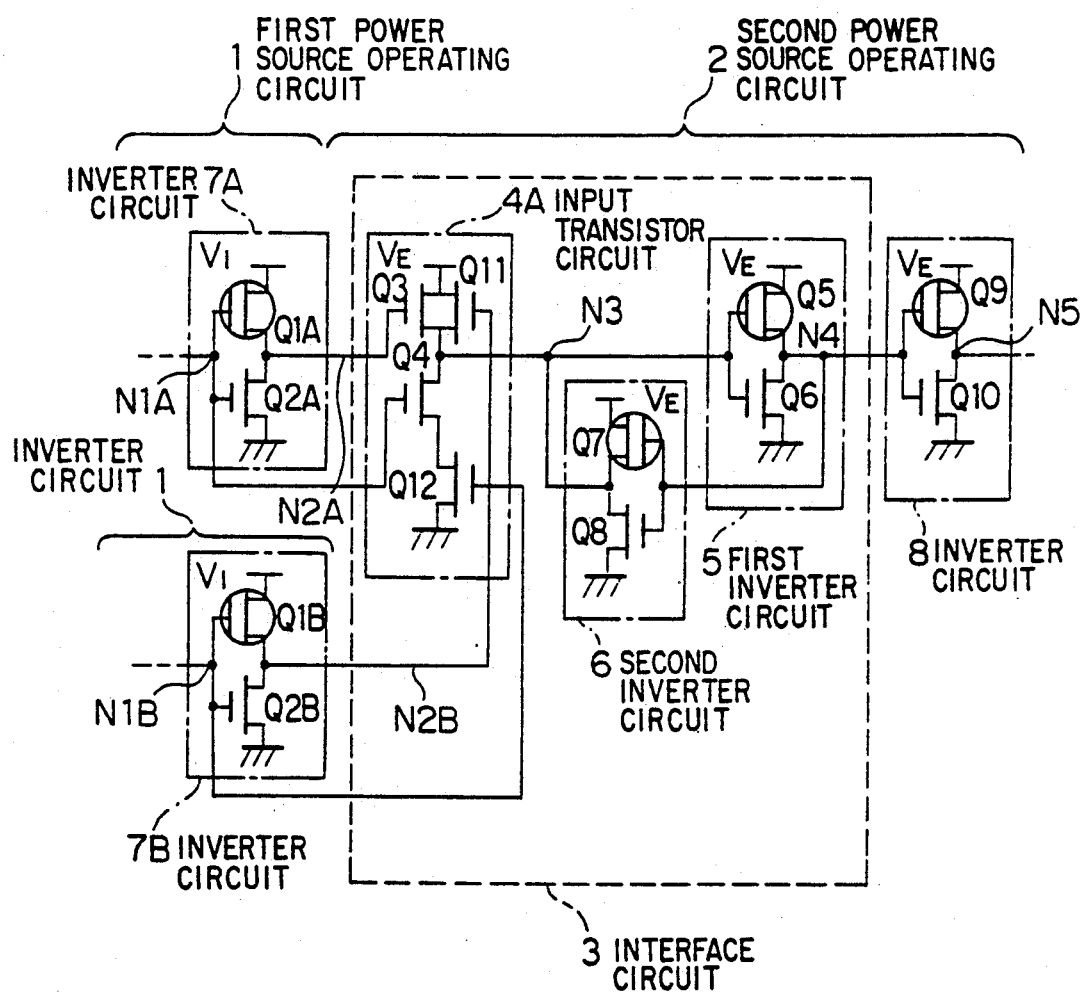
FIG. 6 is a circuit diagram showing a second embodiment of an interface circuit for different power sources of the present invention.

Referring now to FIG. 6, there is shown a second embodiment of an interface circuit for different power sources.

As shown in FIG. 6, in this embodiment, there are provided a plurality of first power source operating circuits. The present embodiment is different from the former embodiment in that the structure of the input transistor circuit 4 of the interface circuit 3 is different. The present embodiment is identical with the former embodiment in that N channel MOS transistors Q3 and Q4 are connected between the power source ($V_E$) and the ground except that N channel MOS transistors Q11 and Q12 are provided for a further first power source operating circuit 1.

Figure 3:
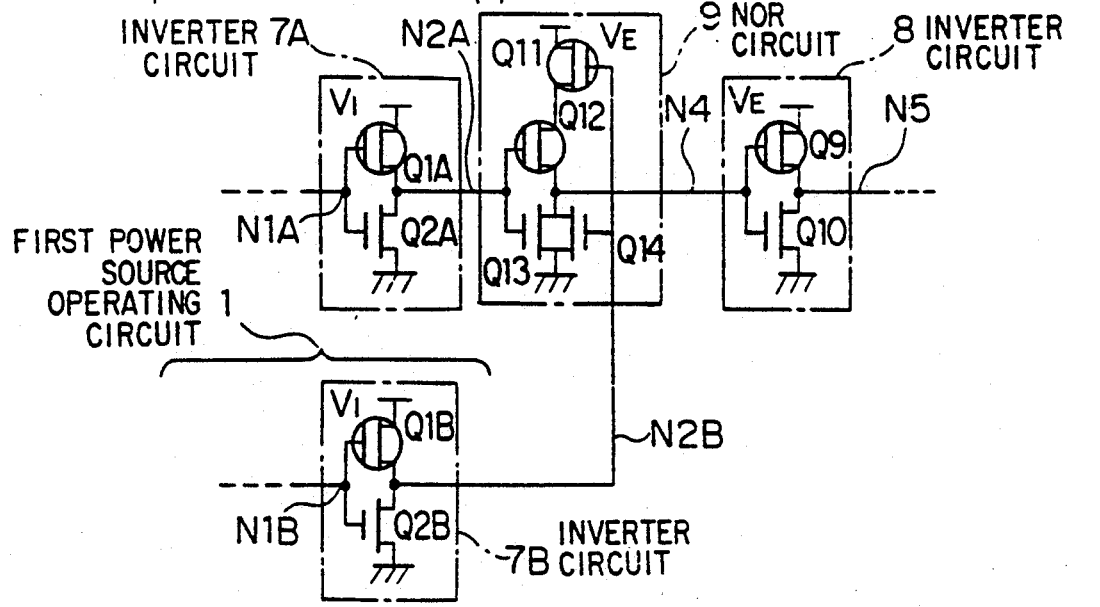
FIG. 3 is a circuit diagram showing another prior art interface circuit for different power sources.

The two-input NOR circuit 9 in the prior art shown in FIG. 3 is replaced with a NOR type interface circuit 3. In the present embodiment, inverter circuits 7A and 7B are supplied with a voltage $V_I$ from a first power source operating circuit 1 while the other circuits are supplied with a voltage $V_E$ from a second power source operating circuit 2 as is similar to the former embodiment.

In accordance with the present embodiment, a node N4 is at a "H" level, that is, $V_E$ representing the same logical state as that of the NOR circuit 9 in the prior art shown in FIG. 3 only when both of nodes N2A and N2B are at a "L" level. Briefly, when a transistor Q3 is turned ON, the transistor Q4 is surely turned OFF. When a transistor Q11 is turned ON, the transistor Q12 is surely turned OFF. When the transistors Q4 and Q12 are turned ON, both the transistors Q3 and Q11 are turned OFF. Therefore, a through-current will not flow.

As mentioned above in accordance with both embodiments, a through-current flowing through the circuit due to P channel MOS transistor which is always turned ON is elminated so that each node is prevented from becoming an intermediate level.

What is claimed is:

1. A different power sources interface circuit for connecting a first power source operating circuit for supplying complementary outputs with a second power source operating circuit having a power source for supplying a voltage higher than that of the power source of the first power source circuit, comprising:
   an input transistor circuit including first and second N channel MOS transistors which are in series connected between said second power source and a ground and have respective gates to which the complementary outputs of said first power circuit are supplied;
   a first inverter circuit having an input connected with a connection between both said transistors; and
   a second inverter circuit having an input and an output thereof which are connected with the output and input of said first inverter circuit, respectively.

* * * * *